United States Patent
Lee

(10) Patent No.: US 9,852,983 B1
(45) Date of Patent: Dec. 26, 2017

(54) FABRICATING METHOD OF ANTI-FUSE STRUCTURE

(71) Applicant: UNITED MICROELECTRONICS CORPORATION, Hsinchu (TW)

(72) Inventor: Dai Yang Lee, New Taipei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/428,137

(22) Filed: Feb. 8, 2017

(51) Int. Cl.
*H01L 23/525* (2006.01)
*H01L 21/266* (2006.01)
*H01L 21/768* (2006.01)
*H01L 27/112* (2006.01)
*G11C 17/16* (2006.01)

(52) U.S. Cl.
CPC ........ *H01L 23/5252* (2013.01); *H01L 21/266* (2013.01); *H01L 21/76897* (2013.01); *G11C 17/16* (2013.01); *H01L 27/11206* (2013.01)

(58) Field of Classification Search
None
See application file for complete search history.

(56) References Cited

U.S. PATENT DOCUMENTS

| | | | |
|---|---|---|---|
| 5,095,362 A * | 3/1992 | Roesner | G11C 17/16 257/330 |
| 5,641,985 A * | 6/1997 | Tamura | H01L 23/5252 257/209 |
| 5,741,731 A * | 4/1998 | Yuuki | H01L 23/5256 257/E23.149 |
| 5,783,467 A * | 7/1998 | Han | H01L 27/112 257/E21.666 |
| 5,793,094 A | 8/1998 | Sanchez et al. | |
| 5,899,707 A * | 5/1999 | Sanchez | H01L 23/5252 257/E23.147 |
| 7,241,663 B2 | 7/2007 | Howard et al. | |

FOREIGN PATENT DOCUMENTS

JP                05121556 A  *  5/1993

* cited by examiner

*Primary Examiner* — Brett Feeney
*Assistant Examiner* — Erik T Peterson
(74) *Attorney, Agent, or Firm* — Ding Yu Tan

(57) ABSTRACT

A fabricating method of an anti-fuse structure, comprising: providing a substrate having a first conductive plug and a second conductive plug separated from the first conductive plug; forming an amorphous silicon layer on the substrate, wherein a portion of the amorphous silicon layer overlapping the first conductive plug is defined as a first region, and a portion of the amorphous silicon layer overlapping the second conductive plug is defined as a second region; performing an implantation process to the first region and the second region, wherein the first region has a higher doping concentration than the second region; forming a titanium nitride layer on the amorphous silicon layer; and patterning the titanium nitride layer and the amorphous silicon layer.

13 Claims, 4 Drawing Sheets

FABRICATING METHOD OF ANTI-FUSE STRUCTURE

FIELD OF THE INVENTION

The present invention relates to a fabricating method of an anti-fuse structure.

BACKGROUND OF THE INVENTION

The use of fuses and anti-fuses (or antifuses) in integrated circuits has become widespread in recent years. And integrated circuits (ICs) often require selectively permanently programmable electrical connections between circuit nodes. Such a connection can be implemented by an anti-fuse link (anti-fuse). An anti-fuse is a structure alterable to a conductive state, or in other words, an electronic device that changes state from not conducting to conducting. Equivalently, the binary states can be either one of high resistance and low resistance in response to electric stress, such as a programming voltage or current.

A conventional anti-fuse structure is fabricated with structure similar to that of a capacitor: two electrical terminals are separated by a dielectric layer. In order to connect the two electrical terminals (in other words, to program an anti-fuse structure), a programming voltage is applied across the anti-fuse terminals for breaking down the interposed dielectric layer and forming a conductive link between the anti-fuse terminals. However, the programming voltage depends only on a thickness of the dielectric layer that makes it difficult to design different programming voltages on one wafer/chip.

Accordingly, there is a need in the art for a process to achieve higher design flexibility of anti-fuse structures.

SUMMARY OF THE INVENTION

The present invention provides a fabricating method of an anti-fuse structure, comprising: providing a substrate having a first conductive plug and a second conductive plug separated from the first conductive plug; forming an amorphous silicon layer on the substrate, wherein a portion of the amorphous silicon layer overlapping the first conductive plug is defined as a first region, and a portion of the amorphous silicon layer overlapping the second conductive plug is defined as a second region; performing an implantation process to the first region and the second region, wherein the first region has a higher doping concentration than the second region; forming a titanium nitride layer on the amorphous silicon layer; and patterning the titanium nitride layer and the amorphous silicon layer.

In one embodiment of the present invention, wherein the substrate further comprises an interlayer dielectric separating the first conductive plug and second conductive plug.

In one embodiment of the present invention, wherein the amorphous silicon layer covers the entire substrate directly contacting the first conductive plug, the second conductive plug and the interlayer dielectric in the step of forming the amorphous silicon layer on the substrate.

In one embodiment of the present invention, wherein the step of patterning the titanium nitride layer and the amorphous silicon layer is to expose the interlayer dielectric entirely.

In one embodiment of the present invention, wherein the interlayer dielectric is an oxide layer.

In one embodiment of the present invention, wherein the step of patterning the titanium nitride layer and the amorphous silicon layer is to remove a portion of the titanium nitride layer and a portion of the amorphous silicon layer exposed by the first and second conductive plugs to form a first anti-fuse stack and a second anti-fuse stack.

In one embodiment of the present invention, wherein the portion of the titanium nitride layer and the portion of the amorphous silicon layer are removed in one etching process.

In one embodiment of the present invention, wherein the first anti-fuse stack has a first programming voltage lower than a second programming voltage of the second anti-fuse stack.

In one embodiment of the present invention, wherein the first region and the second region are P-type doping regions after the implantation process.

In one embodiment of the present invention, wherein the step of performing the implantation process comprises: performing a first doping process on both the first region and the second region; and performing a second doping process on only the first region.

In one embodiment of the present invention, before performing the implantation process, the method further comprising: forming a mask on the amorphous silicon layer to expose the first region and the second region.

In one embodiment of the present invention, wherein the mask exposes the entire first region and only partial the second region.

In one embodiment of the present invention, wherein an exposed ratio of the first region is higher than an exposed ratio of the second region.

Accordingly, the present invention provides a fabricating method of an anti-fuse structure having different breakdown voltages by implanting different dosages of dopant. Thus, different chips of the same wafer can be designed to have different programming voltages to provide better flexibility on manufacturing designs. Moreover, a thickness of the amorphous silicon layer of the present invention can be limited but have a high programming voltage at the meantime. Thus, in addition to better design flexibility, a size of a product, especially with high programming voltages, can be reduced, and material cost can be lower down as well.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a fabricating method of an anti-fuse structure to provide better design flexibility, reduced material cost and improved produce sizes. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application.

Figure 3:
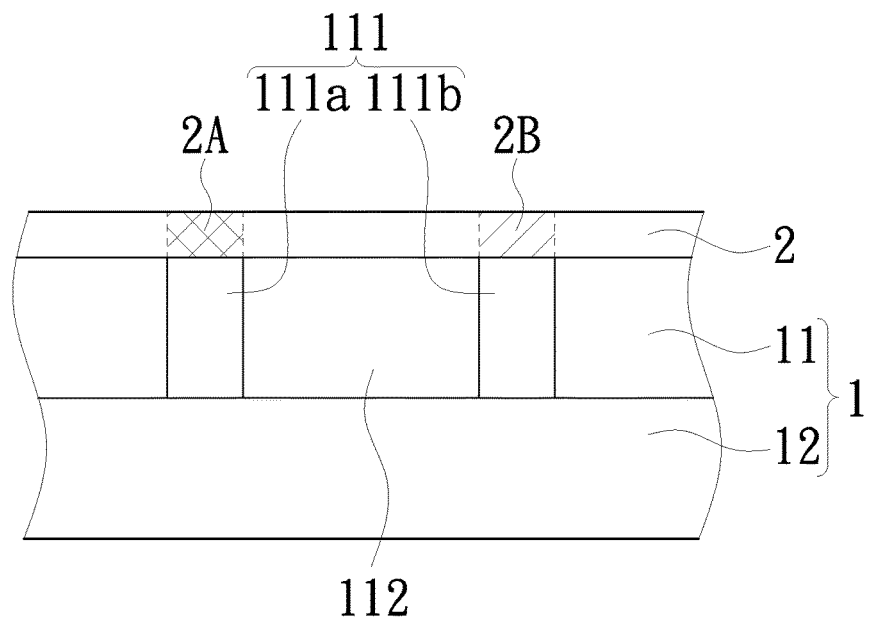
Figure 4:
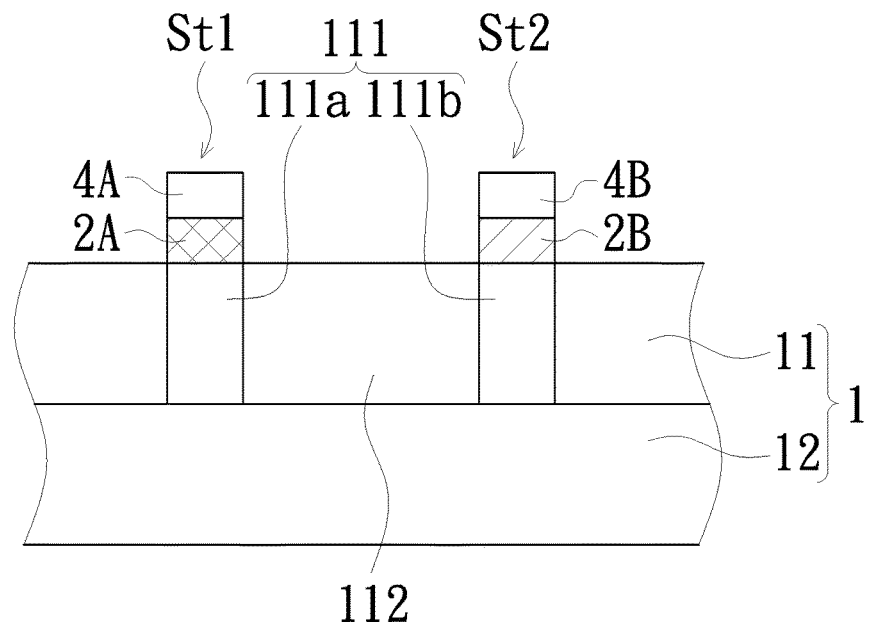
Figure 5A:
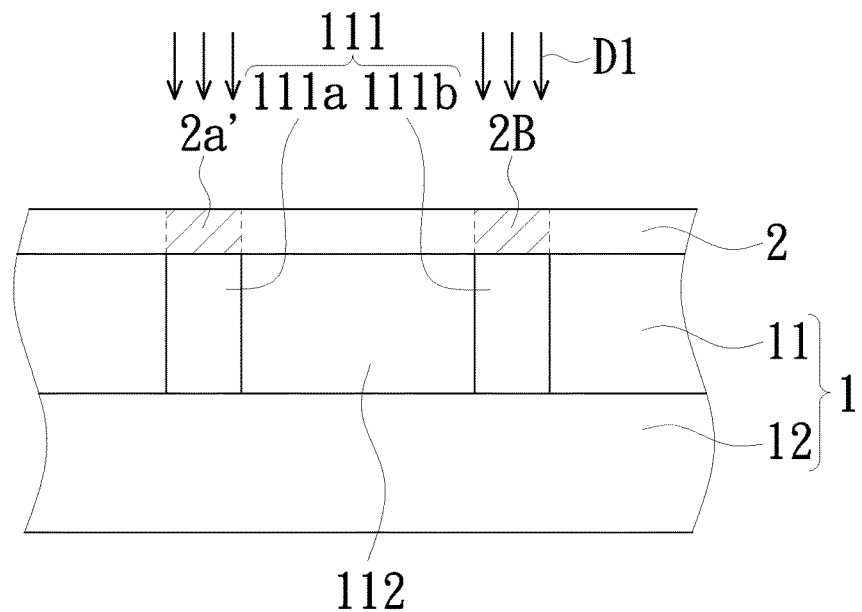
FIGS. 5A-5B are a plurality of cross-sectional views illustrating an implantation process according to an embodiment of the present invention.
Figure 5B:
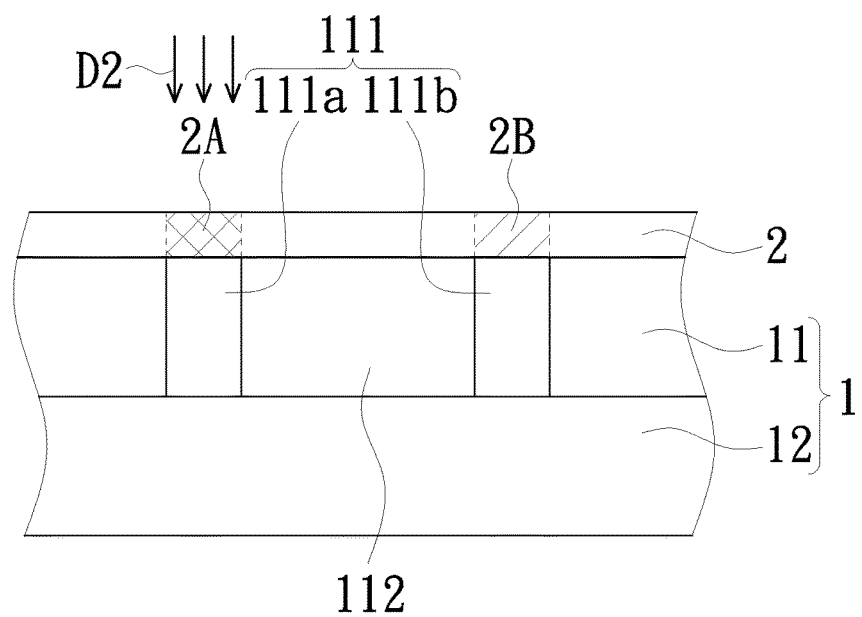
Figure 6:
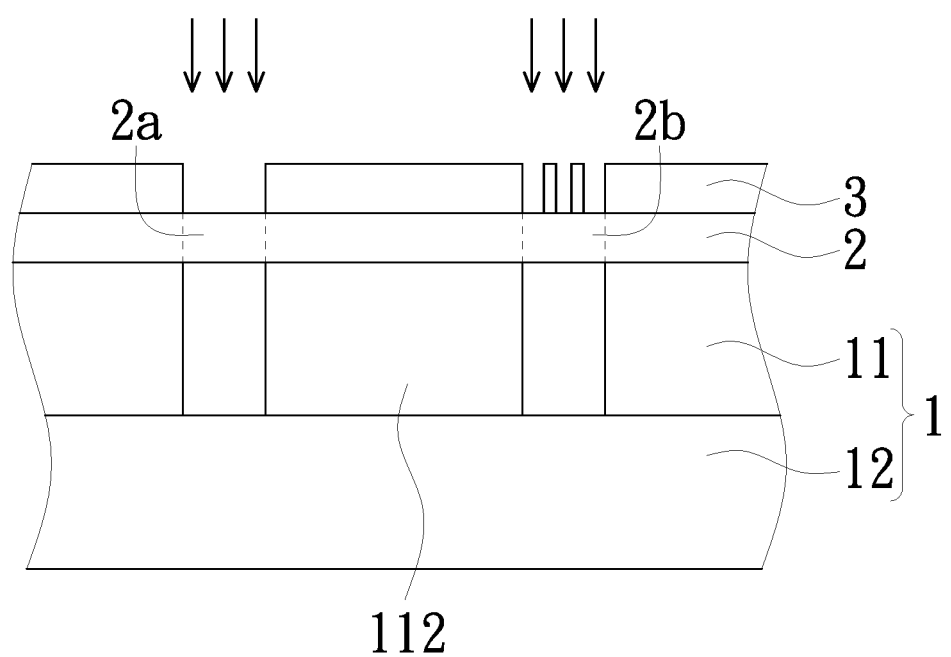
FIG. 6 is a cross-sectional view illustrating an implantation process according to another embodiment of the present invention.

FIGS. 1-4 are cross sectional views of different steps according to a fabrication method of an anti-fuse structure of an embodiment of the present invention for purpose of illustration. And FIGS. 5A-5B and 6 are cross-sectional views of an implantation process according to different embodiments of the present invention for illustration only but not intended to limit the scope of the present invention.

Figure 1:
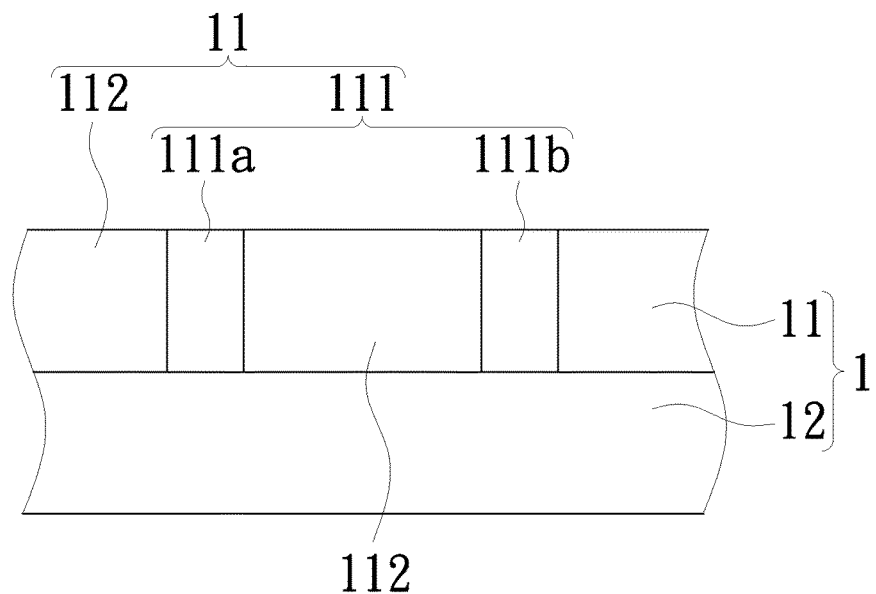
FIGS. 1-4 are a plurality of cross-sectional views of different steps of a fabricating method of an anti-fuse structure according to an embodiment of the present invention.

As shown in FIG. 1, a substrate 1 comprises a MOS layer 12 and an interconnection layer 11 is provided, in which the interconnection layer 11 is formed on the MOS layer 12. The MOS layer 12 comprises a plurality of MOS structures (not shown), and the interconnection layer 11 comprises a plurality of conductive plugs 111 and an interlayer dielectric 112 separating each of the conductive plugs 111. The plurality of conductive plugs 111 of the interconnection layer 11 formed on the MOS structures of the MOS layer 12 are electrically connecting the MOS structures respectively, wherein different conductive plugs 111, e.g. a first conductive plug 111a and a second conductive plug 111b as shown in FIG. 1, penetrate through the interlayer dielectric 112. The cross-sectional structure as shown in FIG. 1 can be formed by conventional methods, and redundant description and detailed structure of the MOS layer 12 are omitted for purposes of brevity. Materials of the conductive plugs 111 and the interlayer dielectric 112 are not limited; for example, the conductive plugs 111 can be made of metal, such as copper, nickel, and cobalt, and the interlayer dielectric 112 can be made of conventional inter-metal dielectric (IMD) materials, such as oxide.

Figure 2:
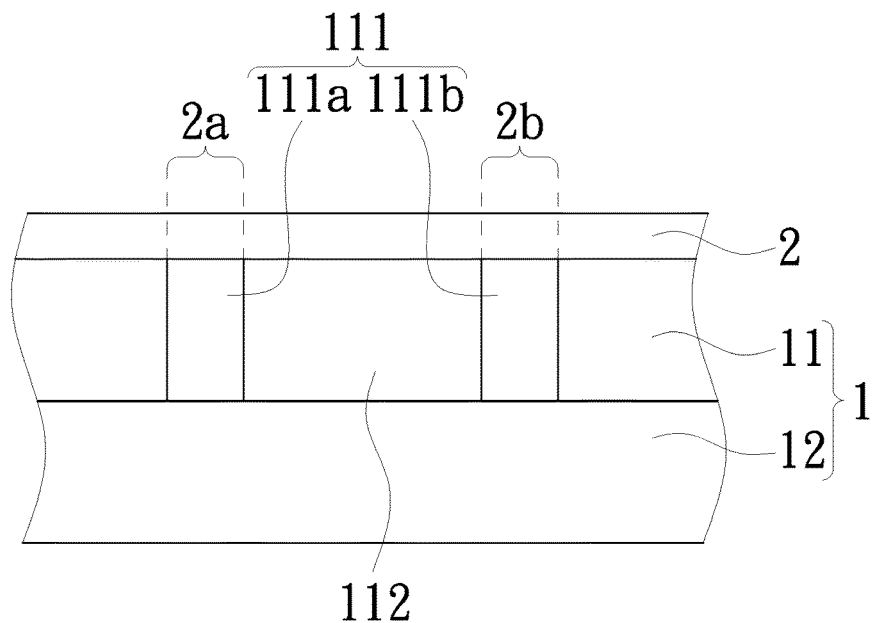

Then as shown in FIG. 2, an amorphous silicon layer 2 is formed on and covering the entire substrate 1 and directly contacting with the interlayer dielectric 112 and the conductive plugs 111, respectively, wherein a portion of the amorphous silicon layer 2 directly overlapping the first conductive plug 111a is defined to be as a first region 2a, and a portion of the amorphous silicon layer directly overlapping the second conductive plug 111b is defined to be as a second region 2b.

An implantation process is performed afterward on the first region 2a and the second region 2b of the amorphous silicon layer 2 to form a first region 2A and a second region 2B as shown in FIG. 3, wherein a doping concentration of the first region 2A is higher than a doping concentration of the second region 2B. According to an embodiment of the present invention as shown in FIG. 5A-5B, the implantation process comprises a plurality of doping processes. A first doping process D1 is firstly performed on both of the first region 2a and the second region 2b to form a first region 2a' and the second region 2B as shown in FIG. 5A; and then a second doping process D2 is performed on only the first region 2a' to form the first region 2A as shown in FIG. 5B. In this embodiment, only the first and second doping processes D1 and D2 are performed to form the first and second regions 2A and 2B having different doping concentrations; however, it is for illustration purposes but is not intended to limit spirit or scope of the present invention. In other embodiment, different times/durations of doping processes can be performed to form the first region 2A (with higher doping concentration) and the second region 2B (with lower doping concentration). Dosages and time durations of the doping processes are not limited, and they can be adjusted by different programming voltages required in different applications.

According to another embodiment of the present invention as shown in FIG. 6, a patterned mask 3 is formed on the amorphous silicon layer 2 before the implantation process. The patterned mask 3 exposes the first region 2a and the second region 2b of the amorphous silicon layer 2, wherein an exposed area ratio of the first region 2a is higher than an exposed area ratio of the second region 2b. In this embodiment, the patterned mask 3 exposes the entire first region 2a and only partially exposing the second region 2b. And also in this embodiment, a portion of the patterned mask 3 covering the second region 2b is in a fence-like shape in order to expose only a portion of the second region 2b. However, a pattern (structure) of the patterned mask 3 is not limited to a specific shape as long as the mask 3 exposes a higher area ratio of the first region 2a than that of the second region 2b, e.g. one circular opening of the patterned mask 3 over the second region 2b exposes only a portion of the second region 2b. Then the implantation process is performed on the first region 2a and the second region 2b, and due to the exposed area ratio of the first region 2a being higher than the exposed area ratio of the second region 2b, a doping concentration of the first region 2A is higher than that of the second region 2B after the implantation process. Dosages and time durations of the doping processes are not limited, and they can be adjusted by different programming voltages required in different applications. Then the patterned mask 3 is removed to form the structure as shown in FIG. 3.

A doping type of the implantation process can be N-type or P-type, and the present invention is not limited herein. In the above embodiments, P-type dopants are used in both embodiments.

A titanium nitride layer (not shown) is then formed on the amorphous silicon layer 2 covering the entire substrate 1. As shown in FIG. 4, the titanium nitride layer and the amorphous silicon layer 2 are patterned by a photolithography process to form a first titanium nitride portion 4A on the first region 2A and a second titanium nitride portion 4B on the second region 2B, respectively. In the step of patterning, the titanium nitride layer and the amorphous silicon layer 2 can be patterned in one etching process or two separated etching processes depending on the etchant(s) used. The patterning process removes the entire portion of the titanium nitride layer and the amorphous silicon layer 2 covering on the interlayer dielectric 112 exposed by the conductive plugs 111 so as to expose the entire interlayer dielectric 112, and only the first region 2A and the second region 2B of the amorphous silicon layer 2, the titanium nitride portion 4A entirely overlapping the first region 2A, and the titanium nitride portion 4B entirely overlapping the second region 2B are left behind. A first anti-fuse stack St1, including the first conductive plug 111a, the first region 2A and the first titanium nitride portion 4A, and a second anti-fuse stack St2, including the second conductive plug 111b, the second region 2B and the second titanium nitride portion 4B, are thereby formed.

In a conventional anti-fuse structure, a programming voltage is adjusted by a thickness of the dielectric layer of the anti-fuse structure. The present invention provides a fabricating method for anti-fuse structure to adjust (or having capability to adjust) a programming voltage by a doping concentration of the amorphous silicon layer, and a product size of an anti-fuse device having a high programming voltage can be reduced. Another drawback of the conventional anti-fuse structure is that, in the manufacturing process thereof, a thickness of the dielectric layer is uniformed within a wafer, and it is difficult to produce chips with different programming voltages within a wafer. However, according to the manufacturing method for anti-fuse structure of the present invention, thicknesses of the amorphous silicon layer within the wafer are still uniform while programming voltages can be different (i.e. an anti-fuse stack with a higher doping concentration of the amorphous silicon layer has a lower programming voltage) (e.g. the first anti-fuse stack St1 of the above embodiment has a programming voltage lower than that of the second anti-fuse stack St2 of the same embodiment). Thus, design flexibility is highly improved without changing or enhancing complexity and cost of the manufacturing process. Moreover, it uses amorphous silicon working or serving as the conventional dielectric layer in-between the two electrical terminals in the present invention for better diffusion of dopant of the implantation process. And no annealing or thermal activation is required after the implantation process for even doping concentration with the region (the first region 2A or the second region 2B). Therefore, the present invention provides a fabricating method of an anti-fuse structure that improves design flexibility, reduces product sizes and lowers material and manufacturing cost (especially for anti-fuse structure with high programming voltages).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of an anti-fuse structure, comprising:
    providing a substrate having a first conductive plug and a second conductive plug separated from the first conductive plug;
    forming an amorphous silicon layer on the substrate, wherein a portion of the amorphous silicon layer overlapping the first conductive plug is defined as a first region, and a portion of the amorphous silicon layer overlapping the second conductive plug is defined as a second region;
    performing an implantation process to the first region and the second region, wherein the first region has a higher doping concentration than the second region;
    forming a titanium nitride layer on the amorphous silicon layer; and
    patterning the titanium nitride layer and the amorphous silicon layer.

2. The method of manufacturing the anti-fuse structure according to claim 1, wherein the substrate further comprises an interlayer dielectric separating the first conductive plug and second conductive plug.

3. The method of manufacturing the anti-fuse structure according to claim 2, wherein the amorphous silicon layer covers the entire substrate directly contacting the first conductive plug, the second conductive plug and the interlayer dielectric in the step of forming the amorphous silicon layer on the substrate.

4. The method of manufacturing the anti-fuse structure according to claim 2, wherein the step of patterning the titanium nitride layer and the amorphous silicon layer is to expose the interlayer dielectric entirely.

5. The method of manufacturing the anti-fuse structure according to claim 2, wherein the interlayer dielectric is an oxide layer.

6. The method of manufacturing the anti-fuse structure according to claim 1, wherein the step of patterning the titanium nitride layer and the amorphous silicon layer is to remove a portion of the titanium nitride layer and a portion of the amorphous silicon layer exposed by the first and second conductive plugs to form a first anti-fuse stack and a second anti-fuse stack.

7. The method of manufacturing the anti-fuse structure according to claim 6, wherein the portion of the titanium nitride layer and the portion of the amorphous silicon layer are removed in one etching process.

8. The method of manufacturing the anti-fuse structure according to claim 6, wherein the first anti-fuse stack has a first programming voltage lower than a second programming voltage of the second anti-fuse stack.

9. The method of manufacturing the anti-fuse structure according to claim 1, wherein the first region and the second region are P-type doping regions after the implantation process.

10. The method of manufacturing the anti-fuse structure according to claim 1, wherein the step of performing the implantation process comprises:
    performing a first doping process on both the first region and the second region; and
    performing a second doping process on only the first region.

11. The method of manufacturing the anti-fuse structure according to claim 1, before performing the implantation process, further comprising:
    forming a mask on the amorphous silicon layer to expose the first region and the second region.

12. The method of manufacturing the anti-fuse structure according to claim 11, wherein the mask exposes the entire first region and only partial the second region.

13. The method of manufacturing the anti-fuse structure according to claim 11, wherein an exposed area ratio of the first region is higher than an exposed area ratio of the second region.

* * * * *